United States Patent
Nakatsuka et al.

(10) Patent No.: US 7,623,007 B2
(45) Date of Patent: Nov. 24, 2009

(54) DEVICE INCLUDING PIEZOELECTRIC THIN FILM AND A SUPPORT HAVING A VERTICAL CROSS-SECTION WITH A CURVATURE

(75) Inventors: Hiroshi Nakatsuka, Osaka (JP); Keiji Onishi, Osaka (JP); Takehiko Yamakawa, Osaka (JP); Tomohiro Iwasaki, Osaka (JP); Tomohide Kamiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 279 days.

(21) Appl. No.: 11/580,139

(22) Filed: Oct. 13, 2006

(65) Prior Publication Data
US 2007/0085633 A1   Apr. 19, 2007

(30) Foreign Application Priority Data

| Oct. 19, 2005 | (JP) | ............................ 2005-304170 |
| Oct. 20, 2005 | (JP) | ............................ 2005-305486 |
| Apr. 28, 2006 | (JP) | ............................ 2006-125550 |

(51) Int. Cl.
*H03H 9/05* (2006.01)
*H03H 9/54* (2006.01)
*H03H 9/70* (2006.01)
*H01H 57/00* (2006.01)
*H02N 2/00* (2006.01)

(52) U.S. Cl. .................. 333/133; 333/105; 333/187; 333/262; 310/330; 310/348; 200/181

(58) Field of Classification Search ......... 333/187–189, 333/262, 105, 133; 310/330–332, 348, 349; 200/181
See application file for complete search history.

(56) References Cited

U.S. PATENT DOCUMENTS

| 6,204,737 | B1 * | 3/2001 | Ella ........................... 333/187 |
| 6,504,118 | B2 * | 1/2003 | Hyman et al. ............... 200/181 |
| 6,778,038 | B2 * | 8/2004 | Takeishi et al. ............. 333/133 |
| 6,927,649 | B2 * | 8/2005 | Metzger et al. ............. 333/133 |
| 6,954,117 | B2 * | 10/2005 | Komuro et al. ............. 333/133 |
| 6,996,384 | B2 * | 2/2006 | Yamawaki et al. ....... 455/180.1 |
| 7,038,559 | B2 * | 5/2006 | Ruby et al. .................. 333/189 |
| 7,132,723 | B2 * | 11/2006 | Park et al. ................... 257/419 |
| 7,343,655 | B2 * | 3/2008 | Mehta ....................... 29/25.35 |
| 7,417,360 | B2 * | 8/2008 | Kamiyama et al. .......... 310/348 |
| 7,446,629 | B2 * | 11/2008 | Nakamura et al. .......... 333/133 |
| 7,471,176 | B2 * | 12/2008 | Bunyan et al. ................ 335/78 |
| 2005/0012571 | A1 * | 1/2005 | Song et al. .................. 333/192 |
| 2007/0024403 | A1 * | 2/2007 | Kwon et al. ................. 335/78 |

FOREIGN PATENT DOCUMENTS

| JP | 60-68711 |   | 4/1985 |
| JP | 2000-188050 | * | 7/2000 |
| JP | 2000-332568 |   | 11/2000 |
| JP | 2003-217421 |   | 7/2003 |
| JP | 2005-45694 |   | 2/2005 |
| JP | 2005-302711 | * | 10/2005 |

* cited by examiner

*Primary Examiner*—Barbara Summons
(74) *Attorney, Agent, or Firm*—Wenderoth, Lind & Ponack L.L.P.

(57) ABSTRACT

An acoustic resonator includes a substrate, a support section provided on the substrate, a lower electrode provided on the support section, a piezoelectric body provided on the lower electrode, and an upper electrode provided on the piezoelectric body. The lower electrode, the piezoelectric body and the upper electrode form a vibration section. The support section for supporting the vibration section is shaped such that at least one portion of a vertical cross-section thereof has a curvature.

10 Claims, 20 Drawing Sheets

(STEP f)

(STEP g)

(STEP h)

(STEP i)

(STEP f)

(STEP g)

(STEP 程h)

(STEP i)

DEVICE INCLUDING PIEZOELECTRIC THIN FILM AND A SUPPORT HAVING A VERTICAL CROSS-SECTION WITH A CURVATURE

BACKGROUND OF THE INVENTION

1. Field of the Invention

The present invention relates to a device including a piezoelectric thin film and a method for producing such a device, and more specifically to an acoustic resonator and a micromachine switch usable in an radio frequency circuit of mobile communication terminals such as mobile phones, wireless LAN apparatuses and the like, and a method for producing the same.

2. Description of the Background Art

Components built in electronic apparatuses such as mobile phones and the like are demanded to be compact, lightweight, and small in loss and to provide high reliability. For fulfilling such demands, various types of devices including a piezoelectric thin film have been proposed. Devices expected to be compact, lightweight and small in loss are, for example, filters and micromachine switches using an acoustic resonator.

FIG. 13A is a cross-sectional view of an exemplary conventional acoustic resonator (see, for example, Japanese Laid-Open Patent Publication No. 60-68711). In this conventional acoustic resonator, a vibration section including a piezoelectric body 1 interposed between an upper electrode 2 and a lower electrode 3 is placed on a substrate 5. In the substrate 5, a cavity 4 is formed by partially etching the substrate 5 using a precision processing method performed from a surface on which the above-mentioned elements are not formed.

This acoustic resonator vibrates in a thickness direction of the piezoelectric body 1 when an electric field is applied thereto in the thickness direction by the upper electrode 2 and the lower electrode 3. Hereinafter, with reference to FIG. 13B through 13D, an operation of the acoustic resonator in the case where the thickness longitudinal vibration of an infinite flat plate is used will be described. FIG. 13B is a schematic isometric view of the acoustic resonator, which illustrates the operation thereof. FIG. 13C is a graph illustrating a frequency characteristic of admittance of the acoustic resonator. FIG. 13D shows an equivalent circuit configuration of the acoustic resonator.

When an electric field is applied between the upper electrode 2 and the lower electrode 3, an electric energy is converted into a mechanical energy by the piezoelectric body 1. The excited mechanical vibration is a vibration extending in a thickness direction, and extends and contracts in the same direction as the electric field. The acoustic resonator uses the resonating vibration in the thickness direction of the piezoelectric body 1 to operate by resonance at a frequency at which the thickness is equal to ½ wavelength. The thickness longitudinal vibration of the piezoelectric body 1 is guaranteed by the cavity 4. As shown in FIG. 13D, the equivalent circuit of the acoustic resonator includes a series resonance section including a capacitor C1, an inductor L1 and a resistor R1, and a capacitor C0 connected in parallel to the series resonance section. Therefore, the admittance of the acoustic resonator is maximum at the resonance frequency fr and is minimum at the anti-resonance frequency fa. $fr=1/\{2\pi\cdot\sqrt{(L1\cdot C1)}\}$ and $fa=fr\cdot\sqrt{(1+C1/C0)}$.

FIG. 14 is an isometric view of an exemplary conventional micromachine switch using a piezoelectric effect (see, for example, Japanese Laid-Open Patent Publication No. 2003-217421). The conventional micromachine switch includes a signal line conductor 12 provided on a substrate 11, a driving shortcircuit mechanism 15 for shielding passage of radio frequency signals, and a piezoelectric body 16 which is driving means for giving a control signal to shift the driving shortcircuit mechanism 15.

With reference to FIG. 14, for shielding a signal, a voltage is applied to the piezoelectric body 16 as a control signal to put the signal line conductor 12 and ground conductors 13 into contact with a conductive layer 17 provided on a bottom surface of the driving shortcircuit mechanism 15. For allowing a signal to pass, no voltage is applied to the piezoelectric body 16.

In actuality, the conventional acoustic resonator described above has a vibration mode propagating along a plane parallel to the electrodes (transverse mode) in addition to the thickness direction vibration mode (longitudinal mode). In the acoustic resonator, a part of the vibration section is fixed to the substrate 5. Therefore, the vibration propagated parallel to the surface of the electrodes is reflected at the fixed position and thus becomes an unnecessary vibration. This unnecessary vibration causes spurious in the frequency characteristic.

For avoiding the spurious caused by the transverse mode, a technique, shown in FIG. 15, of forming a polygonal cavity in the acoustic resonator is proposed (see, for example, Japanese Laid-Open Patent Publication No. 2000-332568). Since the cavity of the acoustic resonator is polygonal, the vibration in the transverse mode, which is reflected at the fixed position, is propagated in a direction different from the direction of incidence. Thus, the spurious is reduced. Namely, appearance of the spurious in the frequency band of the thickness direction vibration mode of the acoustic resonator is avoided.

However, this technique has problems, for example, that the electrode and the cavity need to be designed for each acoustic resonator, and that redesigning is required each time the frequency or the impedance of the transmission path is changed.

The conventional acoustic resonator has a structure in which the local stress is concentrated on the piezoelectric thin film. Therefore, problems of layer delamination and cracks occur during the production.

For solving these problems, an acoustic resonator shown in FIG. 16 is disclosed (see, for example, Japanese Laid-Open Patent Publication No. 2005-45694). In this acoustic resonator, at a step portion of the interface between a piezoelectric film 32 and a lower electrode 31, which corresponds toward the edge of a gap V, a plurality of planes which are not parallel to the surface of a substrate 30 and have different angles α, β and γ with respect to the surface of the substrate 30 are stacked from the substrate 30 toward the top of the gap V. Owing to such a structure (air bridge), the local stress is prevented from being concentrated on the piezoelectric film 32.

However, with this technique, a support layer 40 needs to have a complicated shape in order to provide a plurality of different angles of the interface of the piezoelectric film 32 and the lower electrode 31 with respect to the surface of the substrate 30. This has a problem of, for example, complicating the production method although alleviating the stress concentration.

In the conventional micromachine switch described above, the driving shortcircuit mechanism 15 and a support section 9 are connected perpendicular to each other. Therefore, when the driving shortcircuit mechanism 15 is shifted mechanically, a stress is concentrated on the connection point and thus the mechanical reliability is lowered.

SUMMARY OF THE INVENTION

Therefore, an object of the present invention is to provide a device including a piezoelectric thin film which is capable of preventing generation of unnecessary vibrations by the transverse mode and thus suppressing spurious, and also capable of avoiding reduction in reliability caused by the concentration of stress.

Another object of the present invention is to provide an effective method for producing such a device.

The present invention is directed to an acoustic resonator vibrating at a predetermined frequency and a micromachine switch utilizing a piezoelectric effect and an electro static effect. In order to attain the objects mentioned above, the acoustic resonator according to the present invention comprises a substrate; a vibration section including a piezoelectric body formed of a piezoelectric thin film, and an upper electrode and a lower electrode interposing the piezoelectric body; and a support section provided between the vibration section and the substrate, the support section having a vertical cross-section, at least a portion of which has a curvature. The micromachine according to the present invention switch comprises a substrate; a driving electrode provided on the substrate; a movable section including a piezoelectric body formed of a piezoelectric thin film, an upper electrode and a lower electrode interposing the piezoelectric body, and a movable electrode for signal lines; and a support section provided between the movable section and the substrate, the support section having a vertical cross-section, at least a portion of which has a curvature.

The vertical cross-section of the support section is preferably narrowest or widest at a central portion in a thickness direction thereof or the vicinity thereof. A surface of the support section which is in contact with the substrate and a surface of the support section which is in contact with the lower electrode are preferably parallel to each other.

The above-described acoustic resonator and the micromachine switch act independently, or alternatively may be provided in a composite device, a filter, a duplexer or a communication apparatus including a plurality of acoustic resonators and/or micromachine switches.

The acoustic resonator and the micromachine switch having the above-described structure is each produced by the steps of forming a piezoelectric body on a first substrate; forming a lower electrode on one main surface of the piezoelectric body; forming a first support member on the lower electrode; forming a second support member on a second substrate; bonding the first support member and the second support member together; separating the first substrate after the step of bonding, thereby transferring the piezoelectric body having the lower electrode formed thereon from the first substrate to the second substrate; and forming an upper electrode on the other main surface of the piezoelectric body.

Typically, the step of bonding is performed by eutectic crystallization bonding of the first support member and the second support member. In this case, the first support member and the second support member are preferably multi-layer films containing at least gold tin (AuSn) or gold silicon (AuSi). The first support member and the second support member may be formed to have different widths or thicknesses.

According to the present invention, the support section acts as an element having a plurality of resonance frequencies, and thus the unnecessary vibration generated by the vibration leak is dispersed (attenuated). As a result, an admittance curve with no spurious between the resonance frequency and the anti-resonance frequency of the vibration section can be obtained.

These and other objects, features, aspects and advantages of the present invention will become more apparent from the following detailed description of the present invention when taken in conjunction with the accompanying drawings.

DETAILED DESCRIPTION OF THE INVENTION (Exemplary Structure of an Acoustic Resonator)

Figure 1:
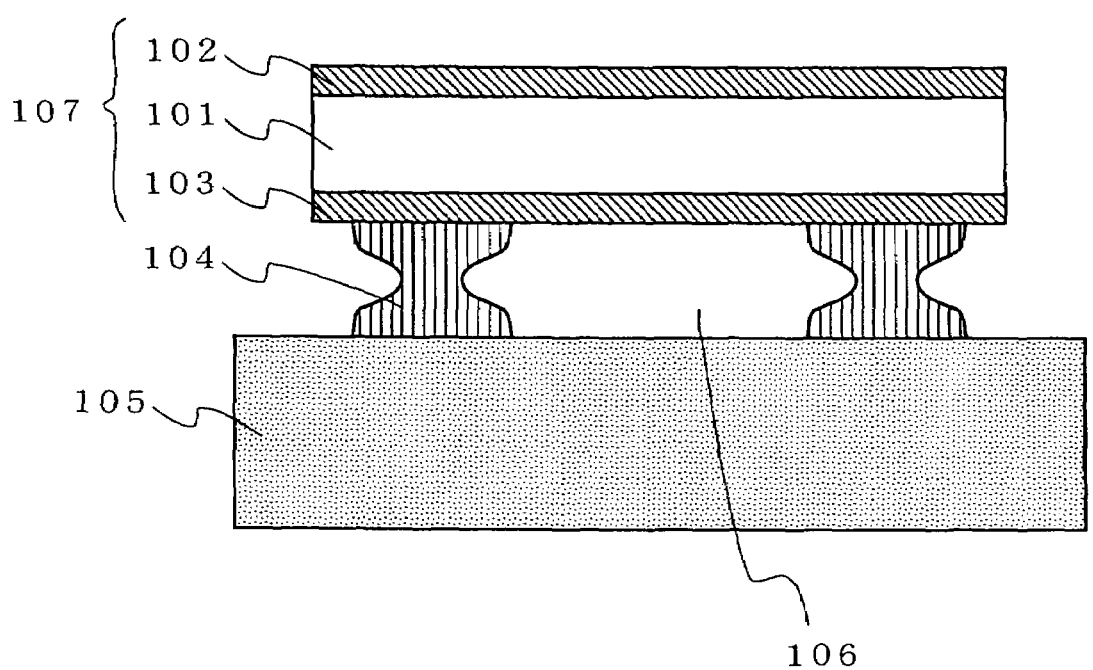
FIG. 1 is a cross-sectional view schematically showing a structure of an acoustic resonator according to one embodiment of the present invention.
Figure 2A:
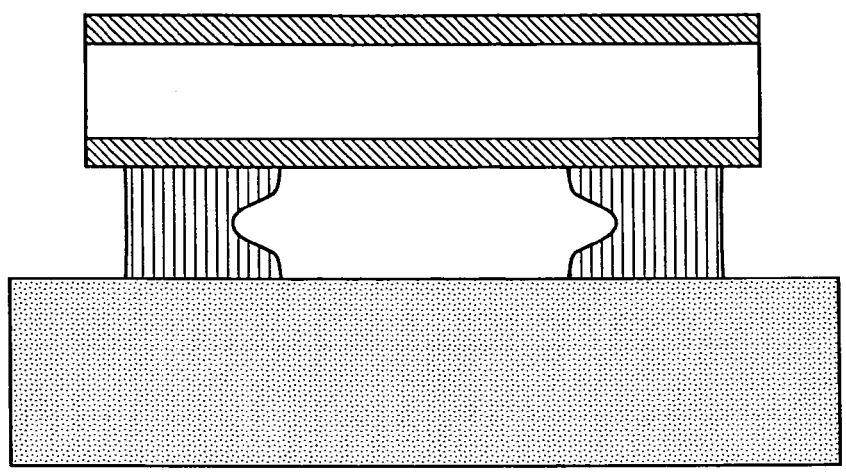
FIG. 2A through FIG. 2F are cross-sectional views schematically showing structures of acoustic resonators according to other embodiments of the present invention.
Figure 2B:
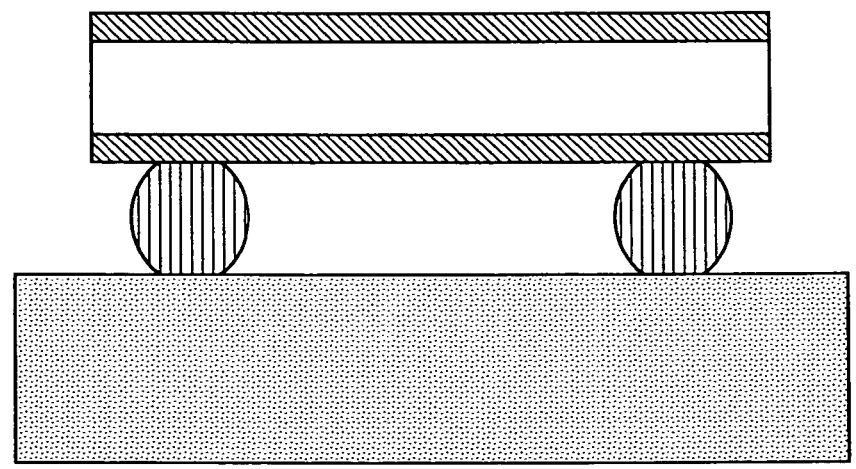
Figure 2C:
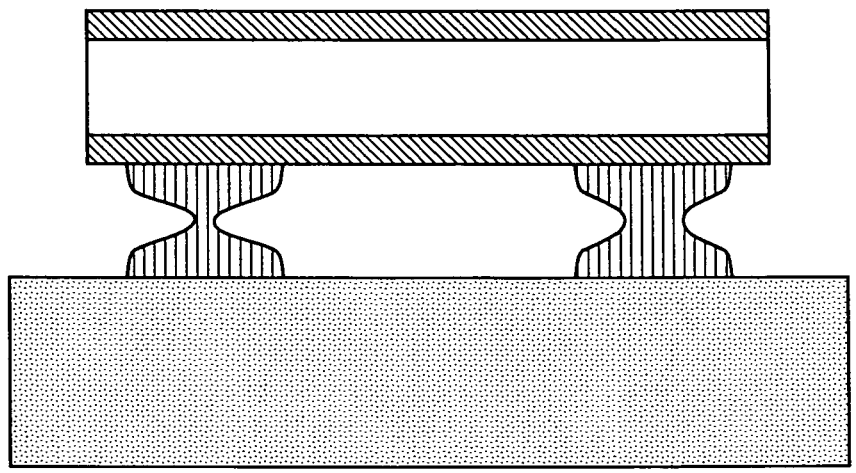
Figure 2D:
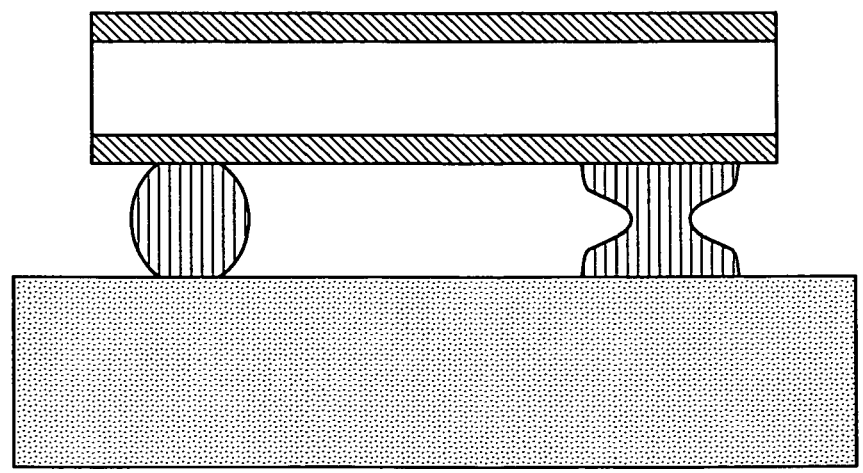
Figure 2E:
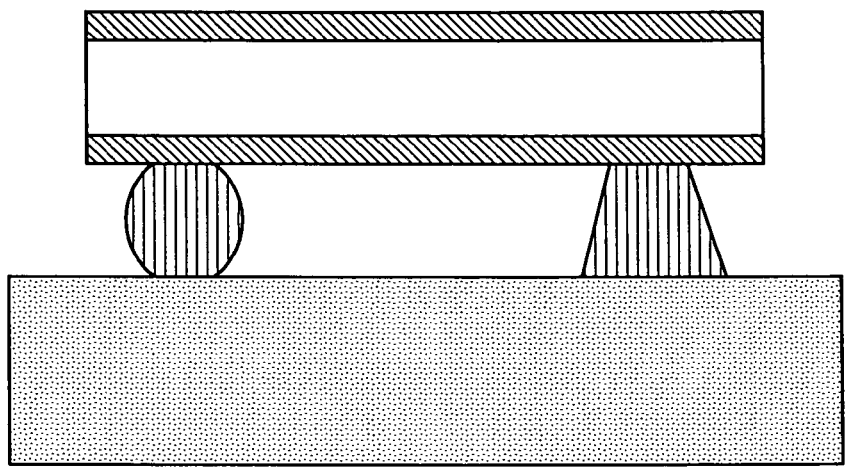
Figure 2F:
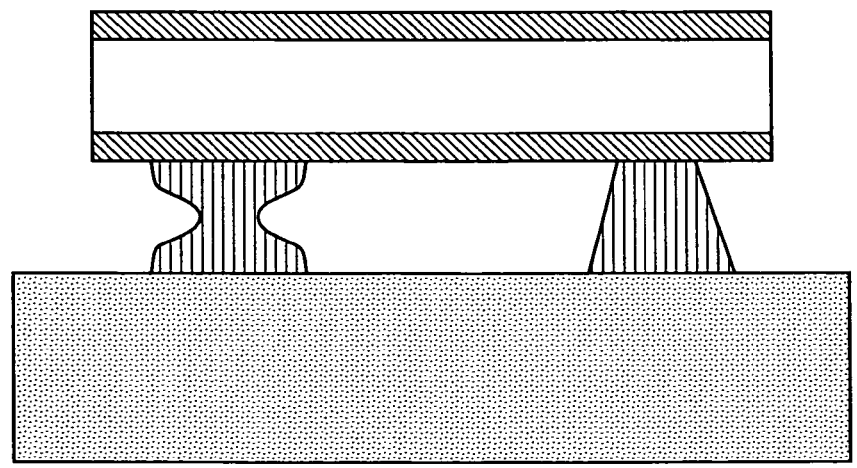

FIG. 1 is a cross-sectional view schematically showing a structure of an acoustic resonator according to an embodiment of the present invention. The acoustic resonator shown in FIG. 1 includes a substrate 105, a support section 104 provided on the substrate 105, a lower electrode 103 provided on the support section 104, a piezoelectric body 101 provided on the lower electrode 103, and an upper electrode 102 provided on the piezoelectric body 101. The lower electrode 103, the piezoelectric body 101 and the upper electrode 102 form a vibration section 107. An area surrounded by the substrate 105, the support section 104 and the lower electrode 103 acts as a cavity 106. The cavity 106 is a space provided in order not to prevent the excitation of the thickness longitudinal vibration of the vibration 107.

The piezoelectric body 101 is formed of a piezoelectric material such as, for example, aluminum nitride (AlN), zinc oxide (ZnO), a lead zirconate titanate (PZT)-system material, lithium niobate ($LiNbO_3$), lithium tantalate ($LiTaO_3$) or potassium niobate ($KNbO_3$). The upper electrode 102 and the lower electrode 103 are formed of a conductive material such as, for example, molybdenum (Mo), aluminum (Al), tungsten (W), platinum (Pt), gold (Au), titanium (Ti) or copper (Cu), a layered metal thereof or an alloy thereof. The substrate 105 is formed of silicon (Si), gallium arsenide (GaAs), SiC or the like.

One feature of the acoustic resonator according to the present invention is that the support section 104 for supporting the vibration section 107 is shaped such that at least one portion of a vertical cross-section thereof has a curvature. A surface of the support section 104 which is in contact with the substrate 105 and a surface of the support section 104 which is in contact with the lower electrode 103 are preferably parallel to each other. For example, as shown in FIG. 1, the support section 104 is narrowed at a central portion in a thickness direction thereof or the vicinity thereof. The support section 104 is formed to have such a vertical cross-section in order to prevent generation of an unnecessary vibration, which causes spurious, in the vicinity of the resonance frequency. The reason why the support section having such a shape prevents generation of unnecessary vibrations is considered to be the following.

As described above regarding the conventional art, the unnecessary vibration is generated because the vibration leaks to the substrate at a fixed position. Therefore, in the case where the resonance frequency of the support section 104 is close to the resonance frequency of the vibration section 107, the vibration excited by the vibration section 107 becomes an unnecessary vibration when such a vibration leaks to the substrate 105 via the support section 104. The vertical cross-section of the support section of the conventional acoustic resonator is rectangular, trapezoidal or of other forms which do not have a curvature. Therefore, there is only one resonance frequency of the support section 104, which results in a large unnecessary vibration.

According to the present invention, the support section 104 is shaped to have a vertical cross-section having a curvature. Owing to such a structure, the support section 104 is made to act as an element having a plurality of resonance frequencies, so that the unnecessary vibration generated by the vibration leak is dispersed (attenuated). As a result, an admittance curve with no spurious between the resonance frequency and the anti-resonance frequency is obtained (see FIG. 4A described later).

The acoustic resonator according to the present invention provides the above-described effect as long as the support section 104 is formed such that at least one portion of the vertical cross-section thereof has a curvature. Therefore, the shape of the support section 104 is not limited to the one shown in FIG. 1, and may be the shapes shown in FIG. 2A through FIG. 2F. The support section 104 may be one ring-shaped element or may include a plurality of columns.

(Exemplary Method for Producing the Acoustic Resonator)

Figure 3A:
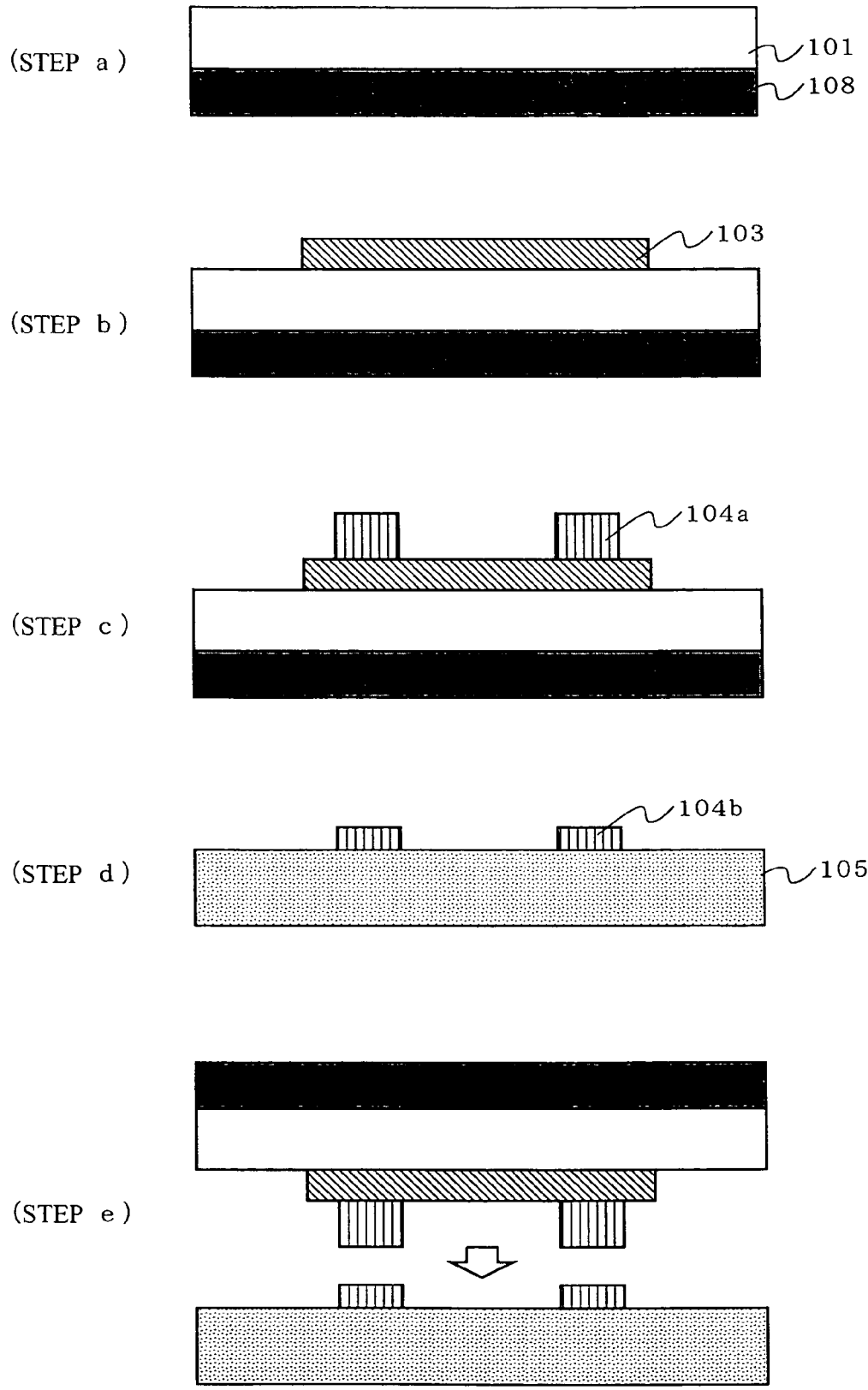
FIG. 3A through FIG. 3B schematically show a method for producing the acoustic resonator shown in FIG. 1.
Figure 3B:
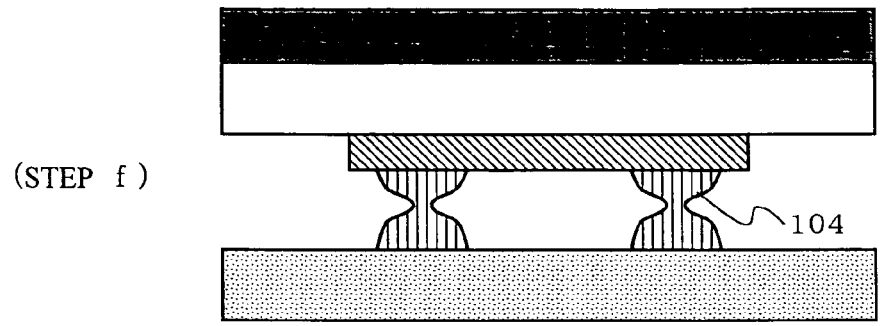
Figure 3B:
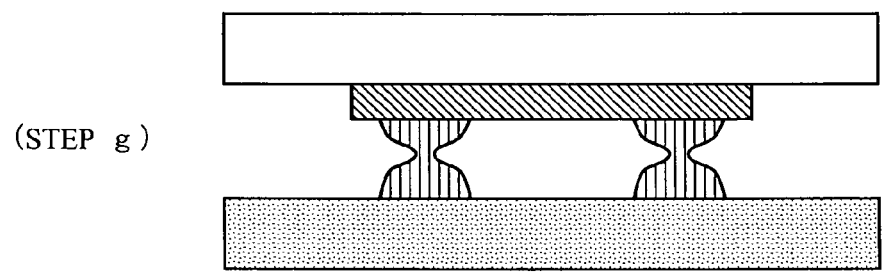
Figure 3B:
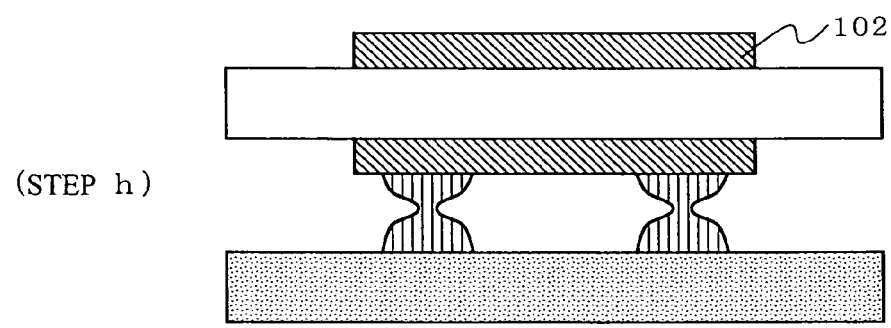
Figure 3B:
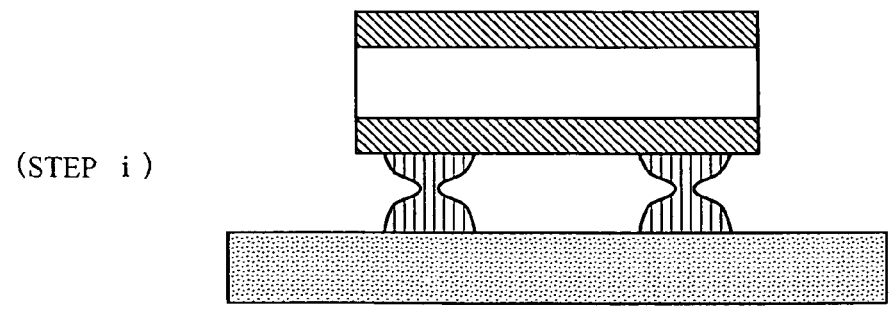

FIG. 3A and FIG. 3B schematically show a preferable method for producing the acoustic resonator having the above-described structure. By this method, the acoustic resonator shown in FIG. 1 is produced using a wafer-to-wafer bonding method.

First, a layer-forming substrate 108 formed of silicon, glass, sapphire or the like is prepared. On the layer-forming substrate 108, a piezoelectric body 101 is formed (FIG. 3A, step a). On the piezoelectric body 101, the lower electrode 103 is formed by film formation and patterning (FIG. 3A, step b). Next, on the lower electrode 103, support members 104a to be a part of the support section 104 are formed (FIG. 3A, step c). Then, a substrate 105 for supporting the vibration section 107 is prepared. On the substrate 105, support members 104b to be a part of the support section 104 are formed (FIG. 3A, step d). The support members 104a and 104b are formed of gold, tin or the like.

Next, the layer-forming substrate 108 and the substrate 105 are positioned such that the support members 104a of the layer-forming substrate 108 and the support members 104b of the substrate 105 face each other. The support members 104a and 104b are bonded together by eutectic crystallization of gold and tin (FIG. 3A, step e). For example, by once melting gold tin at 375° C. and 0.3 MPa and then coagulating the gold tin, the support section 104 having a structure which is not obtained by etching can be easily realized (FIG. 3B, step f). Next, the layer-forming substrate 108 is removed from the assembly of the two substrates 105 and 108 (FIG. 3B, step g). The layer-forming substrate 108 may be removed by, for example, wet etching or dry etching. By steps e through g, the elements originally formed on the layer-forming substrate 108 are transferred onto the substrate 105. Then, on the piezoelectric layer 101, the upper electrode 102 is formed by film formation and patterning (FIG. 3B, step h). Finally, an unnecessary part of the piezoelectric body 101 is removed by etching (FIG. 3B, step i). Thus, the acoustic resonator shown in FIG. 1 is completed.

The production method according to the present invention uses gold tin as the material for the support section 104, and uses a simple bonding method of eutectic crystallization, by which the metal materials are once melted and then coagulated. By such a method, the support section 104 can have a vertical cross-section of a complicated shape having a curvature (the cavity 106 can have a vertical cross-section of a complicated shape having a curvature), which is not obtained by etching or the like.

Figure 4A:
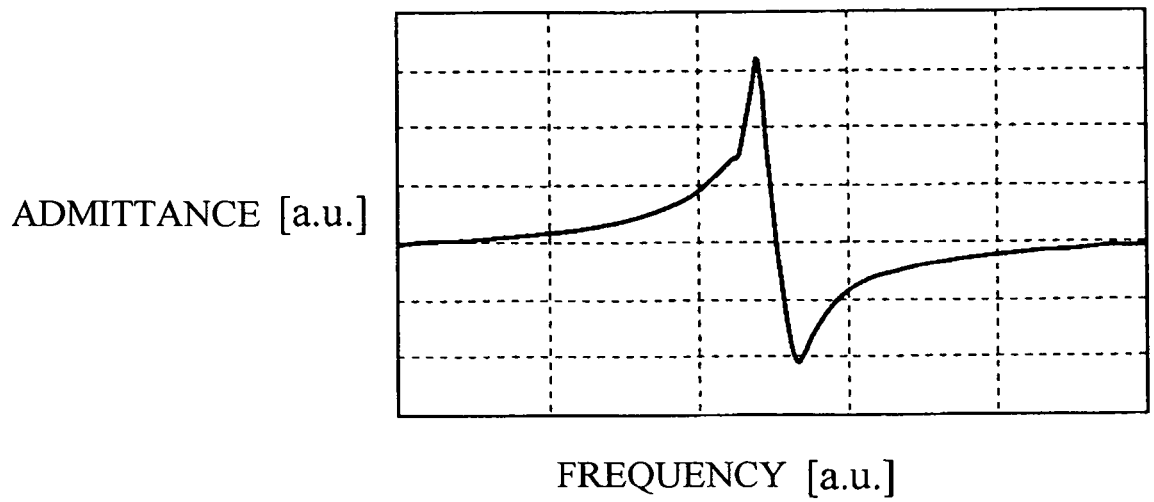
FIG. 4A shows a frequency characteristic of the acoustic resonator according to one embodiment of the present invention.
Figure 4B:
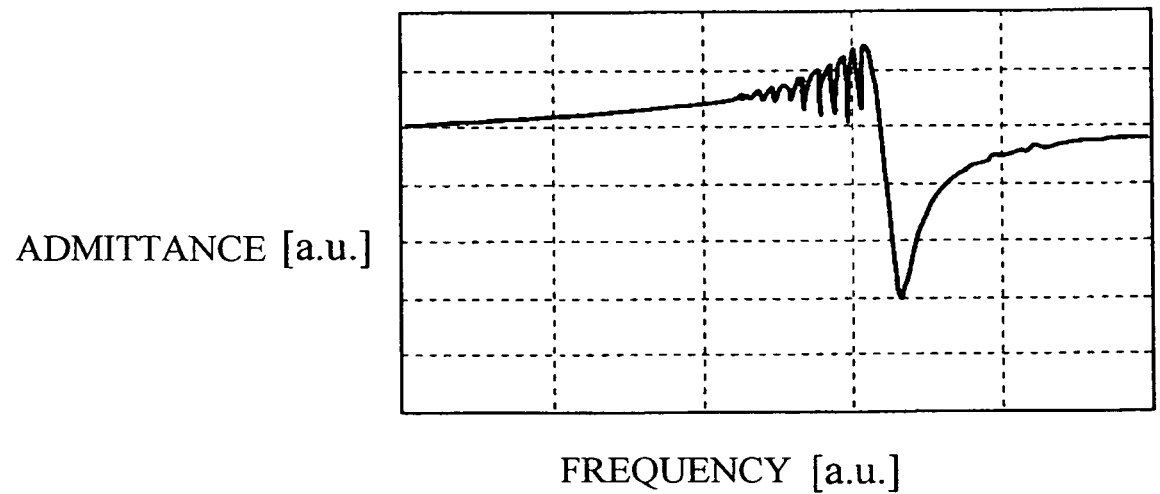
FIG. 4B shows a frequency characteristic of a conventional acoustic resonator.

FIG. 4A shows the frequency characteristic of the acoustic resonator produced by the method according to the present invention. FIG. 4B shows the frequency characteristic of an acoustic resonator produced by a conventional production method (for example, a method of stacking layers sequentially from bottom to top on the substrate while removing a part of the sacrifice layer to form a cavity). As can be understood from FIG. 4A and FIG. 4B, the spurious which is generated at the resonance frequency or the vicinity thereof in the conventional acoustic resonator is not generated in the acoustic resonator according to the present invention.

In this embodiment, gold and tin are used for the eutectic crystallization to form support section 104. Other materials which can be bonded by eutectic crystallization (for example, gold and silicon) are also usable. By using materials having different degrees of melt ability, a support section of a cross-section having a curvature can be easily formed. At least either the support members 104a or 104b need to include gold and tin, and may have a multi-layer structure containing gold and tin. The thickness and the width of the support members 104a and 104b can be freely set.

In this embodiment, the piezoelectric body 101 is directly formed on the substrate 108. Alternatively, another film may be provided between the substrate 108 and the piezoelectric body 101. For example, in the case where the piezoelectric body 101 of AlN is to be provided on the substrate 108, it is preferable to form an AlN layer on the substrate 108, a Mo layer on the AlN layer, and then the piezoelectric body 101 on the Mo layer. In this way, the effect that the piezoelectric body 101 is not directly influenced by the damage occurring when the substrate 108 is removed is provided.

(Exemplary Structure of a Micromachine Switch)

Figure 5A:
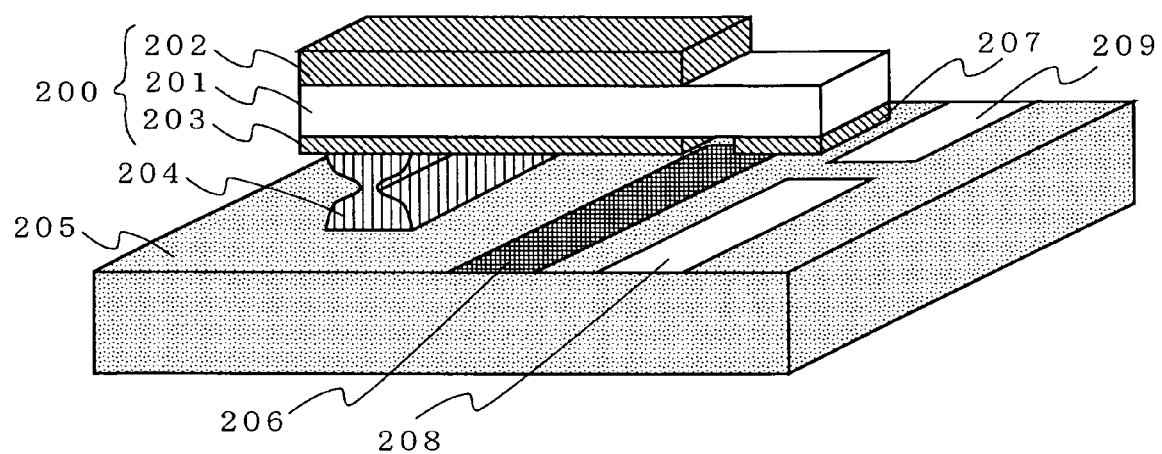
FIG. 5A and FIG. 5B are respectively an isometric view and a cross-sectional view of a micromachine switch according to one embodiment of the present invention.
Figure 5B:
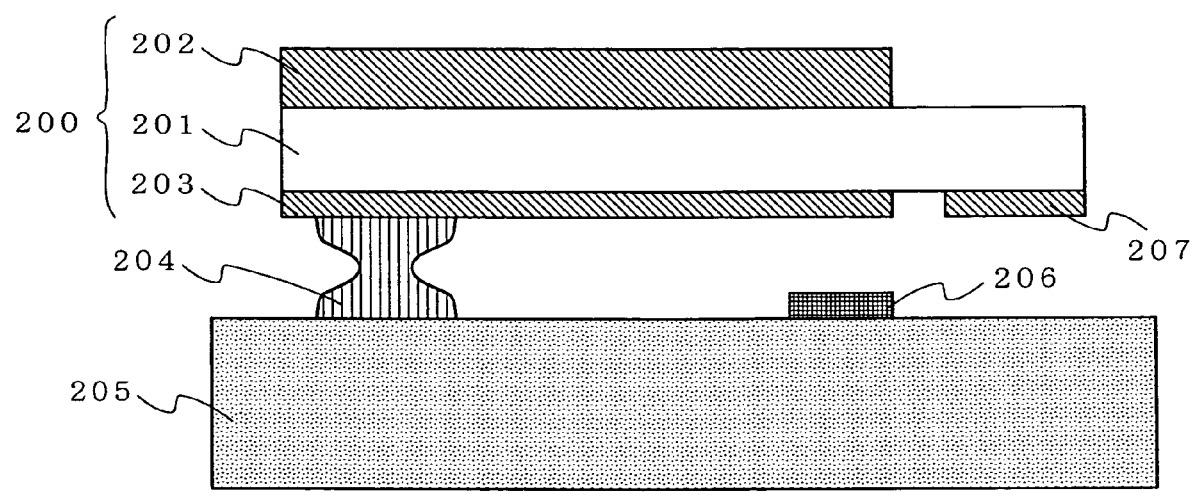

FIG. 5A and FIG. 5B are respectively an isometric view and a cross-sectional view schematically showing a structure of a micromachine switch according to an embodiment of the present invention. The micromachine switch shown in FIG. 5A and FIG. 5B includes a substrate 205, a support section 204 provided on the substrate 205, a lower electrode 203 provided on the support section 204, a piezoelectric body 201 provided on the lower electrode 203, an upper electrode 202 provided on the piezoelectric body 201, a movable electrode 207 for signal lines provided on the main surface of the piezoelectric body 201 on which the lower electrode 203 is provided, and a driving electrode 206 provided on the substrate 205. The lower electrode 203, the piezoelectric body 201 and the upper electrode 202 form a movable section 200. The piezoelectric body 201, the upper electrode 202, the lower electrode 203 and the substrate 205 may be formed of the same materials as described above regarding the acoustic resonator. On the substrate 205, two fixed electrodes 208 and 209 for signal lines are provided at such a position that the fixed electrodes 208 and 209 for signal lines become conductive by contacting the movable electrode 207 for signal lines.

One feature of the micromachine switch according to the present invention is that the support section 204 for supporting the movable section 200 is shaped such that at least one portion of a vertical cross-section thereof has a curvature. A surface of the support section 204 which is in contact with the substrate 205 and a surface of the support section 204 which is in contact with the lower electrode 203 are preferably parallel to each other. For example, as shown in FIG. 5B, the support section 204 is narrowed in a central portion in a thickness direction thereof or the vicinity thereof. The support section 204 is formed to have such a vertical cross-section in order to alleviate stress concentration on a connection portion of the movable section 200 and the support section 204, which occurs at the time of switching. The reason why the support section having such a shape alleviates the stress concentration is considered to be the following.

The movable section 200 is shifted to the substrate 205 by the switching operation. At this point, the support section 204 is fixed and is not moved. Since the movable section 200 is supported and fixed by the support section 204, stress is concentrated on the connection portion of the movable section 200 and the support section 204 or the vicinity thereof.

According to the present invention, the support section 204 is shaped to have a vertical cross-section having a curvature. Owing to such a structure, the stress is dispersed without being concentrated on the connection portion of the movable section 200 and the support section 204. As a result, the maximum distortion at the time of switching can be reduced, and thus mechanical reliability can be improved. Since a top surface of the support section 204 is located parallel to the substrate 205, the initial stress is also reduced. Thus, the maximum distortion is further reduced.

The micromachine switch according to the present invention provides the above-described effect as long as the support section 204 is formed such that at least one portion of the vertical cross-section thereof has a curvature. Therefore, the shape of the micromachine switch is not limited to the cantilever shape, by which the movable section 200 is supported at one end thereof by the support section 204 as shown in FIG. 5A and FIG. 5B, and may be of other shapes.

Figure 6A:
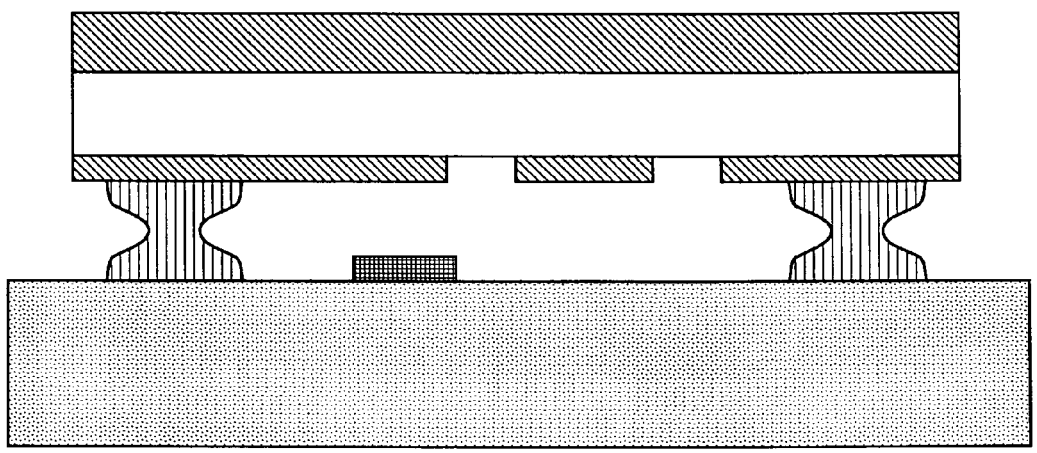
FIG. 6A through FIG. 6G illustrate structures of micromachine switches of other embodiments of the present invention.
Figure 6B:
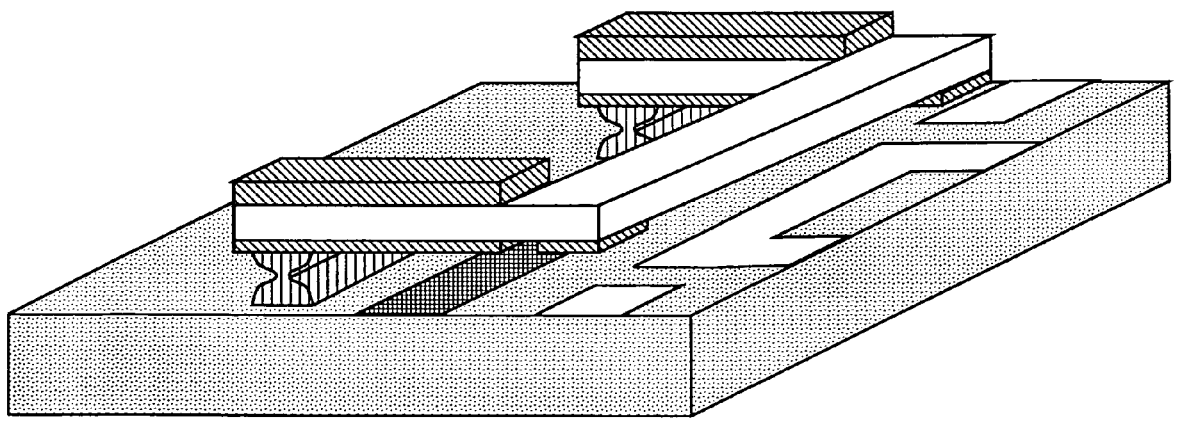
Figure 6C:
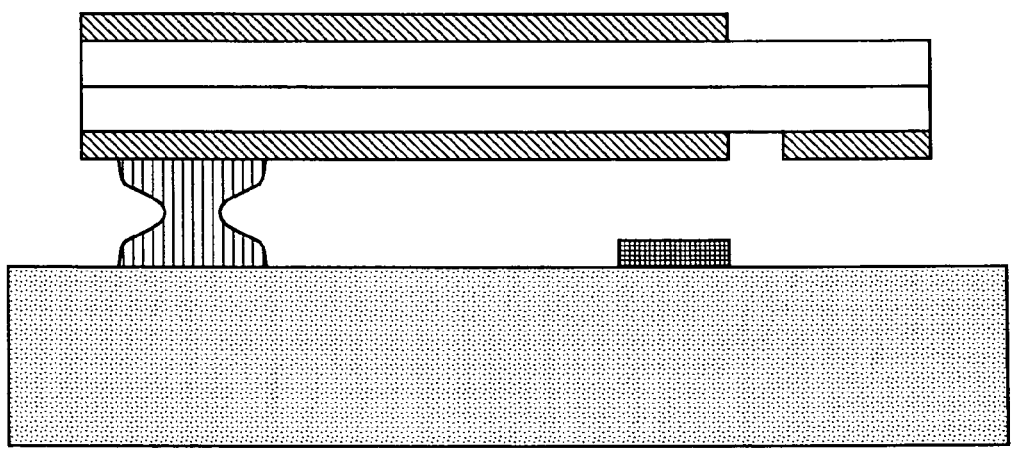
Figure 6D:
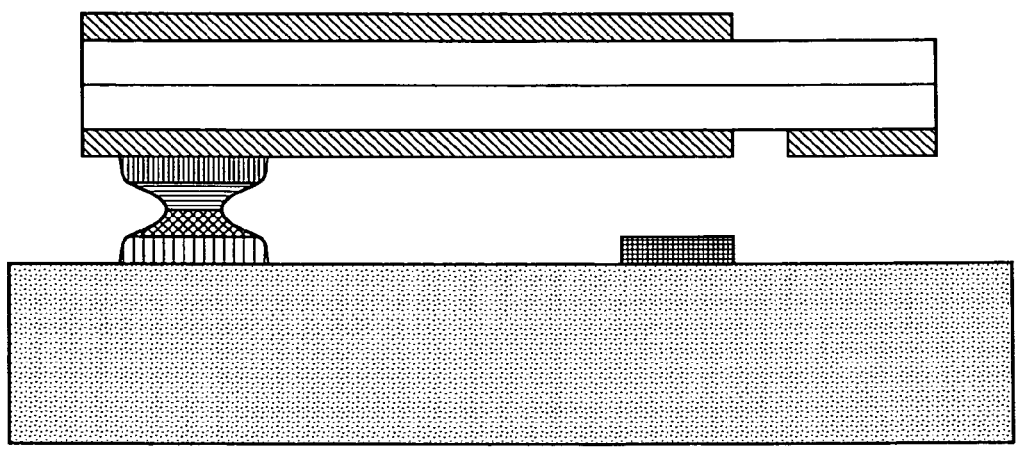

For example, FIG. 6A shows a micromachine switch of a double cantilever shape, by which the movable section is supported at both of two ends thereof. FIG. 6B shows an example in which micromachine switches of a cantilever shape are connected to be generally C-shaped. FIG. 6C shows a micromachine switch in which the upper electrode and the lower electrode are adjusted to have the same thickness using a plurality of piezoelectric thin films. FIG. 6D shows a micromachine switch having a support section of a multi-layer structure containing a plurality of materials. The micromachine switch may have one contact or a plurality of contacts. The support section may be formed of a conductive material and used as a line.

Figure 6E:
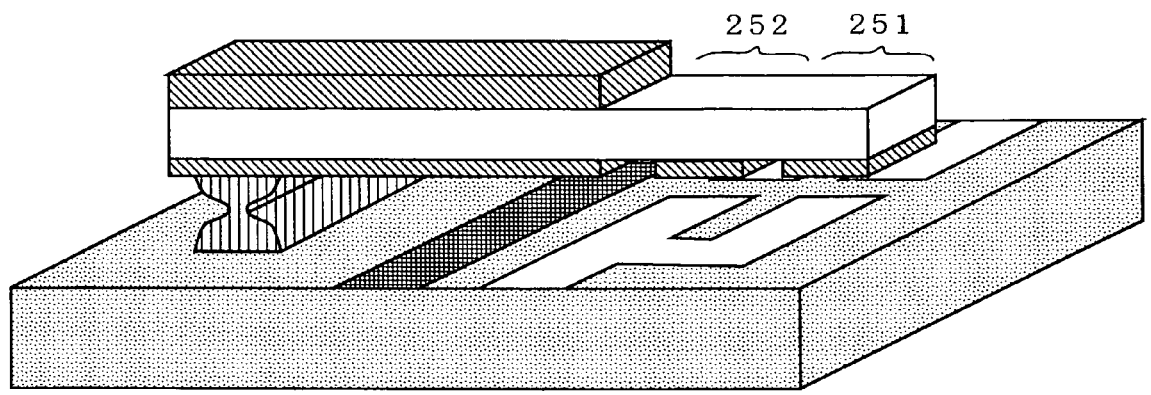
Figure 6F:
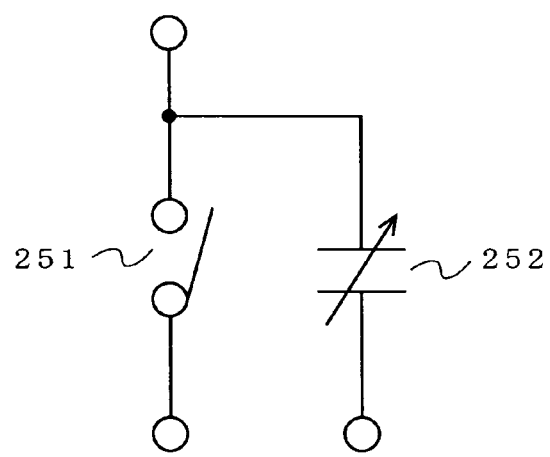
Figure 6G:
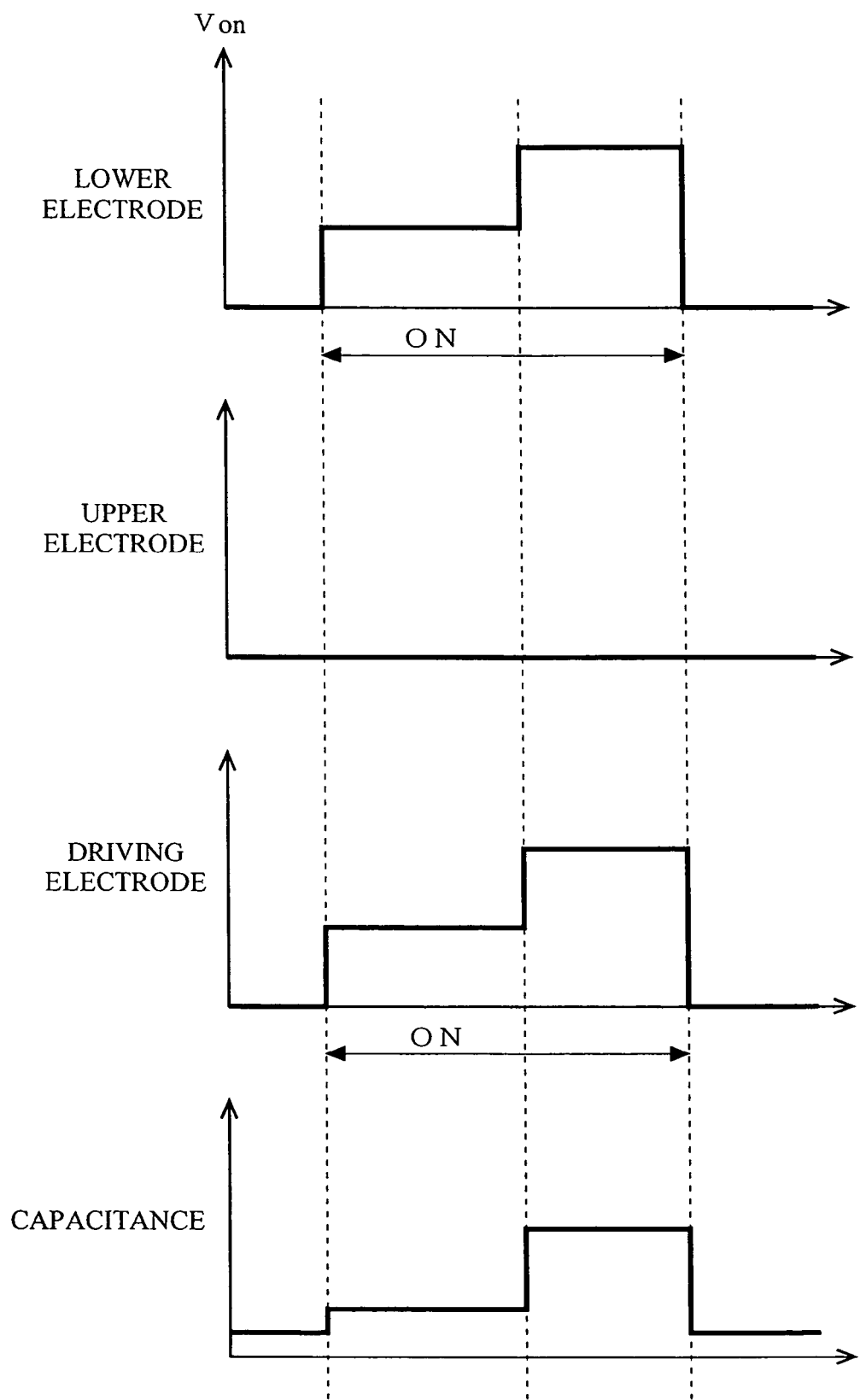

FIG. 6E shows a micromachine switch including a switch section 251 and a variable capacitance section 252. FIG. 6F is an equivalent circuit configuration of the micromachine switch shown in FIG. 6E. This micromachine switch has a gap below the variable capacitance section 252 even when the switch section 251 is turned ON and thus the movable electrode for signal lines and the fixed electrode for signal lines contact each other. With the micromachine switch, as shown in FIG. 6G, the capacitance value of the variable capacitance section 252 is changed by changing the voltage applied to each electrode so as to change the gap width.

(Exemplary Method for Producing the Micromachine Switch)

Figure 7A:
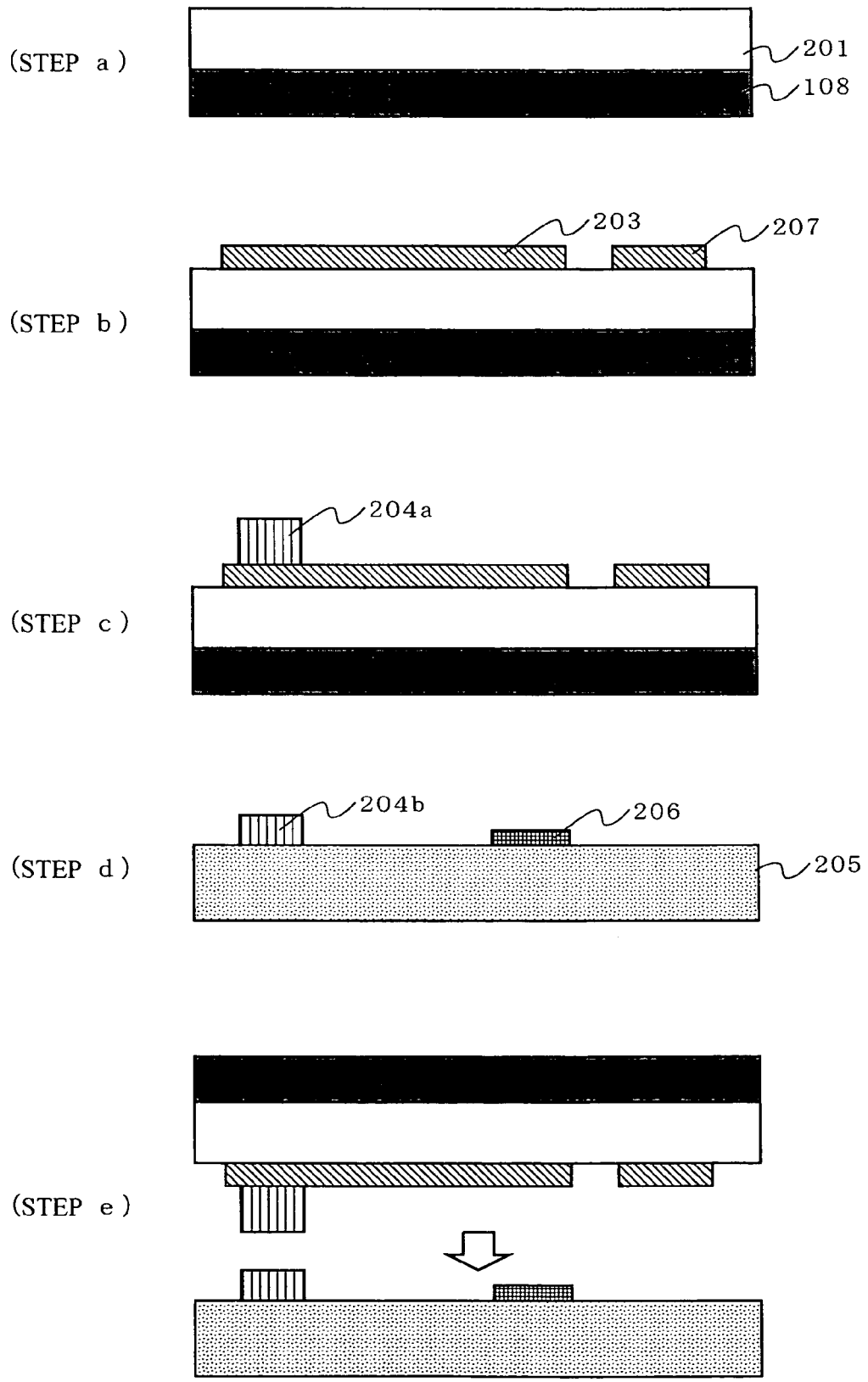
FIG. 7A and FIG. 7B schematically show a method for producing the micromachine switch shown in FIG. 5B.
Figure 7B:
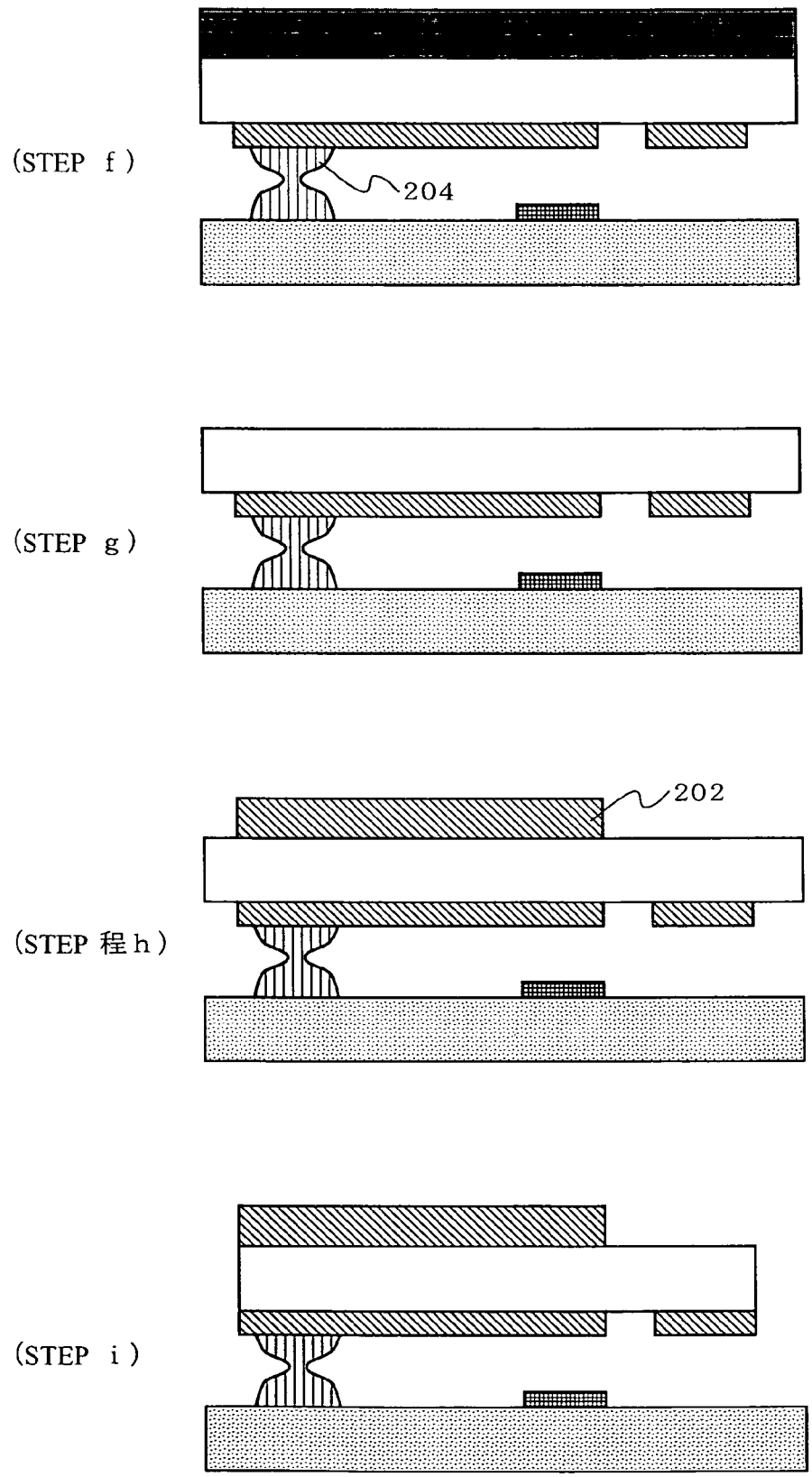

FIG. 7A and FIG. 7B schematically show a preferable method for producing the micromachine switch having the above-described structure. By this method, the micromachine switch shown in FIG. 5B is produced using a wafer-to-wafer bonding method.

First, a layer-forming substrate 108 formed of silicon, glass, sapphire or the like is prepared. On the layer-forming substrate 108, a piezoelectric body 201 is formed (FIG. 7A, step a). On the piezoelectric body 201, the lower electrode 203 and the movable electrode 207 for signal lines are formed by film formation and patterning (FIG. 7A, step b). Next, on the lower electrode 203, a support member 204a to be a part of the support section 204 is formed (FIG. 7A, step c). Then, a substrate 205 for supporting the movable section 200 is prepared. On the substrate 205, a support member 204b to be a part of the support section 204, the driving electrode 206, and the fixed electrodes 208 and 209 for signal lines (not shown in FIG. 7A or 7B) are formed (FIG. 7A, step d). The support members 204a and 204b are formed of gold, tin or the like.

Next, the layer-forming substrate 108 and the substrate 205 are positioned such that the support member 204a of the layer-forming substrate 108 and the support member 204b of the substrate 205 face each other. The support members 204a and 204b are bonded together by eutectic crystallization of gold and tin (FIG. 7A, step e). For example, by once melting gold tin at 375° C. and 0.3 MPa and then coagulating the gold tin, the support section 204 having a structure which is not obtained by etching can be easily realized (FIG. 7B, step f). Next, the layer-forming substrate 108 is removed from the assembly of the two substrates 205 and 108 (FIG. 7B, step g). The layer-forming substrate 108 may be removed by, for example, wet etching or dry etching. By steps e through g, the elements originally formed on the layer-forming substrate 108 are transferred onto the substrate 205. Then, on the piezoelectric layer 201, the upper electrode 202 is formed by film formation and patterning (FIG. 7B, step h). Finally, an unnecessary part of the piezoelectric body 201 is removed by etching (FIG. 7B, step i). Thus, the micromachine switch shown in FIG. 5B is completed.

The production method according to the present invention uses gold tin as the material for the support section 204, and uses a simple bonding method of eutectic crystallization, by which the metal materials are once melted and then coagulated. By such a method, the support section 204 can have a vertical cross-section of a complicated shape having a curvature, which is not obtained by etching or the like.

(Exemplary Driving of the Micromachine Switch)

Figure 8A:
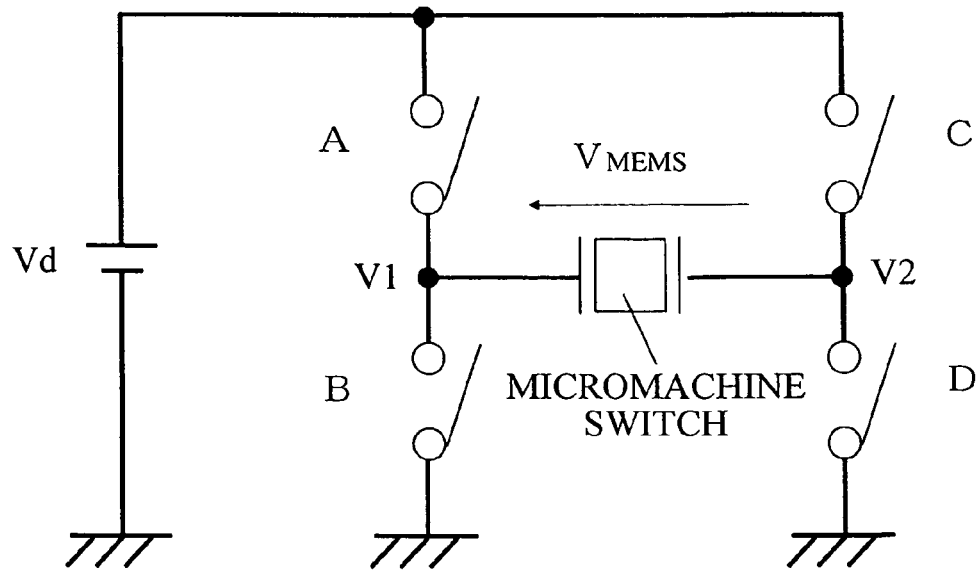
FIG. 8A shows an exemplary driving circuit for the micromachine switch.
Figure 8B:
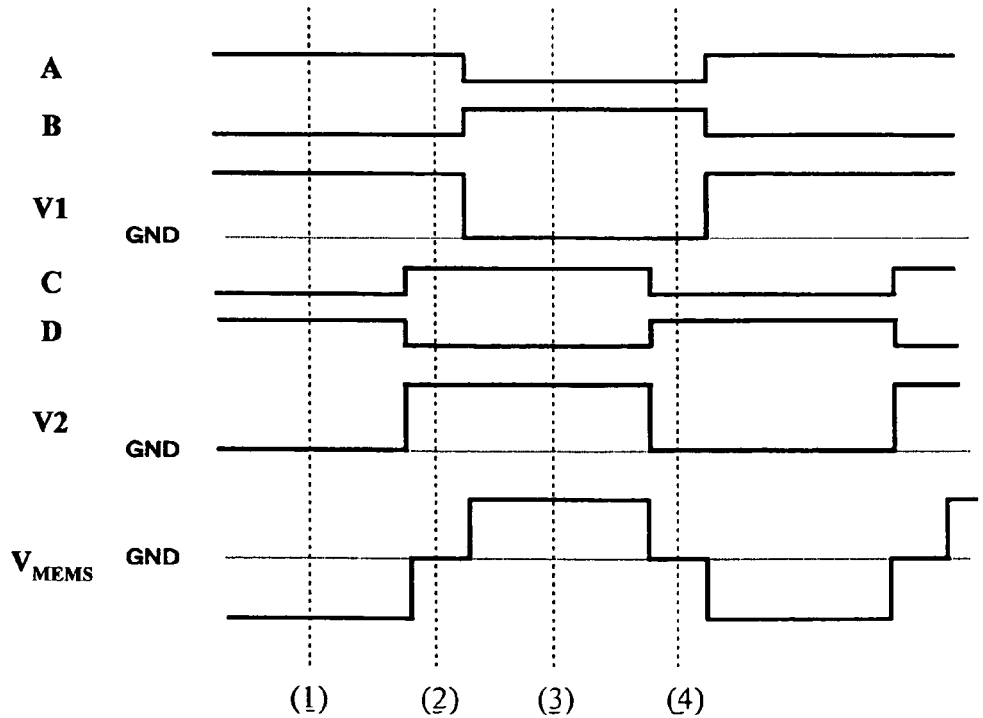
FIG. 8B shows an exemplary operation of the micromachine switch shown in FIG. 8A.

FIG. 8A shows an exemplary driving circuit for the micromachine switch described above. FIG. 8B shows an exemplary operation of the driving circuit for the micromachine switch shown in FIG. 8A. The driving circuit includes a micromachine switch between a connection point of switching elements A and B connected in series and a connection point of switching elements C and D connected in series (the upper electrode 202 and the lower electrode 203 of the micromachine switch are respectively connected to the connection points).

State (1) in FIG. 8B: When the switching element A is in an ON state (when the switching element B is in an OFF state), a supply voltage Vd is applied to a V1 terminal. At this point, the switching element C is in an OFF state (the switching element D is in an ON state). Therefore, a V2 terminal is at the GND potential. As a result, the voltage Vd is applied to the micromachine switch.

State (2) in FIG. 8B: When the switching element A is in an ON state (when the switching element B is in an OFF state), a supply voltage Vd is applied to the V1 terminal. At this point, the switching element C is in an ON state (the switching element D is in an OFF state). Therefore, the V2 terminal is at the Vd potential. As a result, a voltage of 0 V is applied to the micromachine switch.

State (3) in FIG. 8B: When the switching element A is in an OFF state (when the switching element B is in an ON state), the V1 terminal is at the GND potential. At this point, the switching element C is in an ON state (the switching element D is in an OFF state). Therefore, the V2 terminal is at the Vd potential. As a result, a voltage of −Vd is applied to the micromachine switch.

State (4) in FIG. 8B: When the switching element A is in an OFF state (when the switching element B is in an ON state), the V1 terminal is at the GND potential. At this point, the switching element C is in an OFF state (the switching element D is in an ON state). Therefore, the V2 terminal is at the GND potential. As a result, a voltage of 0 V is applied to the micromachine switch.

By such driving, the micromachine switch can be supplied with a voltage of ±Vd with respect to the supply voltage Vd. Both when each switching element is in an ON state and when each switching element is in an OFF state, the micromachine switch can be shifted by the piezoelectric effect. Therefore, a higher speed operation can be performed than by a driving voltage in the range of 0 through Vd.

(Exemplary Structure Using an Acoustic Resonator)

Figure 9:
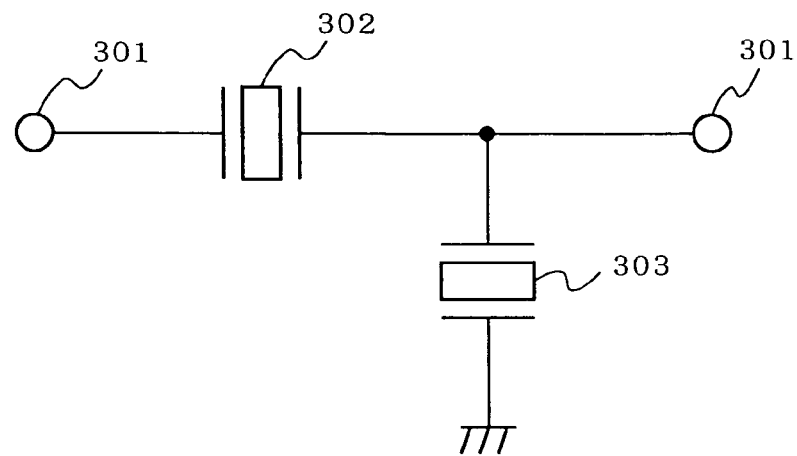
FIG. 9 shows an exemplary circuit of a ladder type filter including acoustic resonators according to the present invention.

FIG. 9 shows an exemplary circuit of a ladder type filter including acoustic resonators according to the present invention. The ladder type filter shown in FIG. 9 includes a series acoustic resonator 302 inserted in series between input/output terminals 301 and a parallel acoustic resonator 303 inserted in parallel. By setting the resonance frequency of the series acoustic resonator 302 to be higher than the resonance frequency of the parallel acoustic resonators 303, a ladder filter having a bandpass characteristic can be realized. Preferably, by substantially matching the resonance frequency of the series acoustic resonator 302 and the anti-resonance frequency of the parallel acoustic resonators 303, a ladder type filter having a flatter passband characteristic can be realized. Use of the above-described acoustic resonators according to the present invention allows the energy to be concentrated only at a desired vibration and thus realizes a ladder type filter with a smaller loss.

Figure 10:
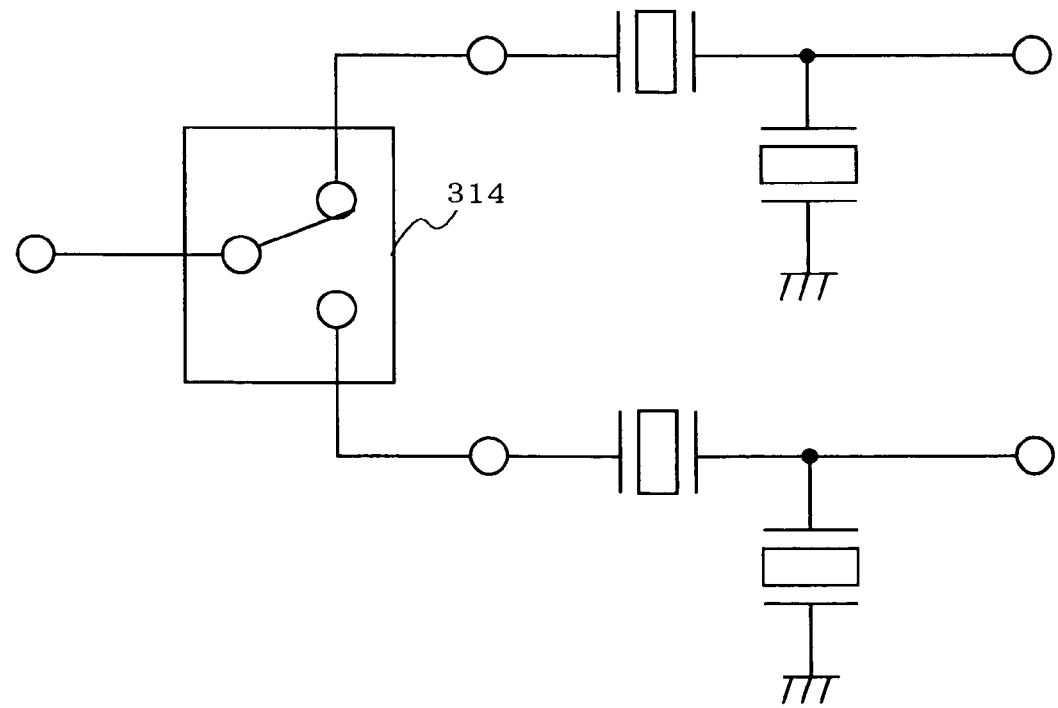
FIG. 10 shows an exemplary circuit of a composite device including acoustic resonators and a micromachine switch according to the present invention.

FIG. 10 shows an exemplary circuit (ladder type filter switching circuit) of a composite device including acoustic resonators and a micromachine switch according to the present invention. The composite device shown in FIG. 10 includes two ladder type filters shown in FIG. 9 connected by a micromachine switch 314.

The number of connectable ladder type filters is not limited to one or two as shown in FIG. 9 and FIG. 10. A greater number of ladder type filters may be connected. The ladder structure is not limited to the L type, and may be, for example, T type or π type. Instead of the ladder type filter, a lattice type filter may be used. In such cases, substantially the same effect is provided.

Figure 11:
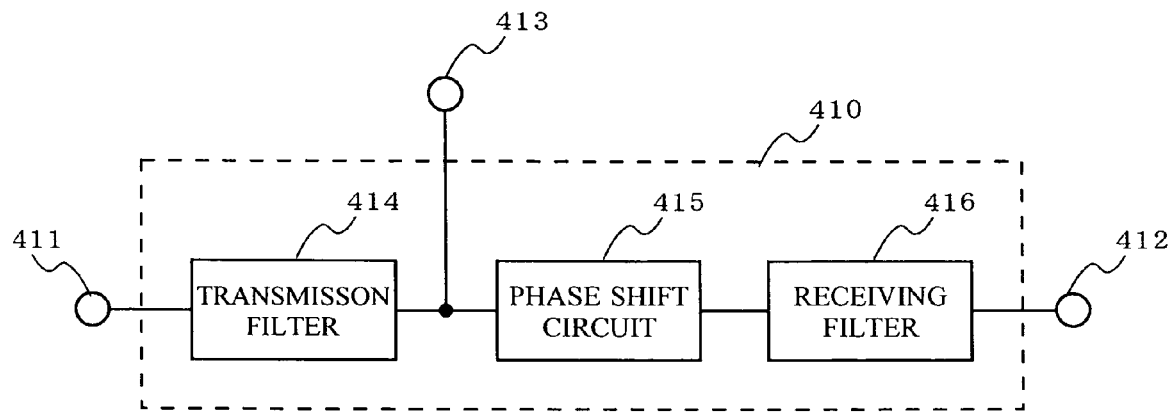
FIG. 11 shows an example of a duplexer including the ladder type filter.

FIG. 11 shows an example of a duplexer 410 including the above-described ladder type filter. The duplexer 410 shown in FIG. 11 includes a transmission filter 414, a phase transfer circuit 415, and a receiving filter 416 directly connected in series between a transmission terminal 411 and a receiving terminal 412, and also includes an antenna terminal 413 connected between the transmission filter 414 and the phase transfer circuit 415. The ladder type filter described above is usable for at least one of the transmission filter 414 and the receiving filter 416. With such a structure, a duplexer with a small loss can be realized.

Figure 12:
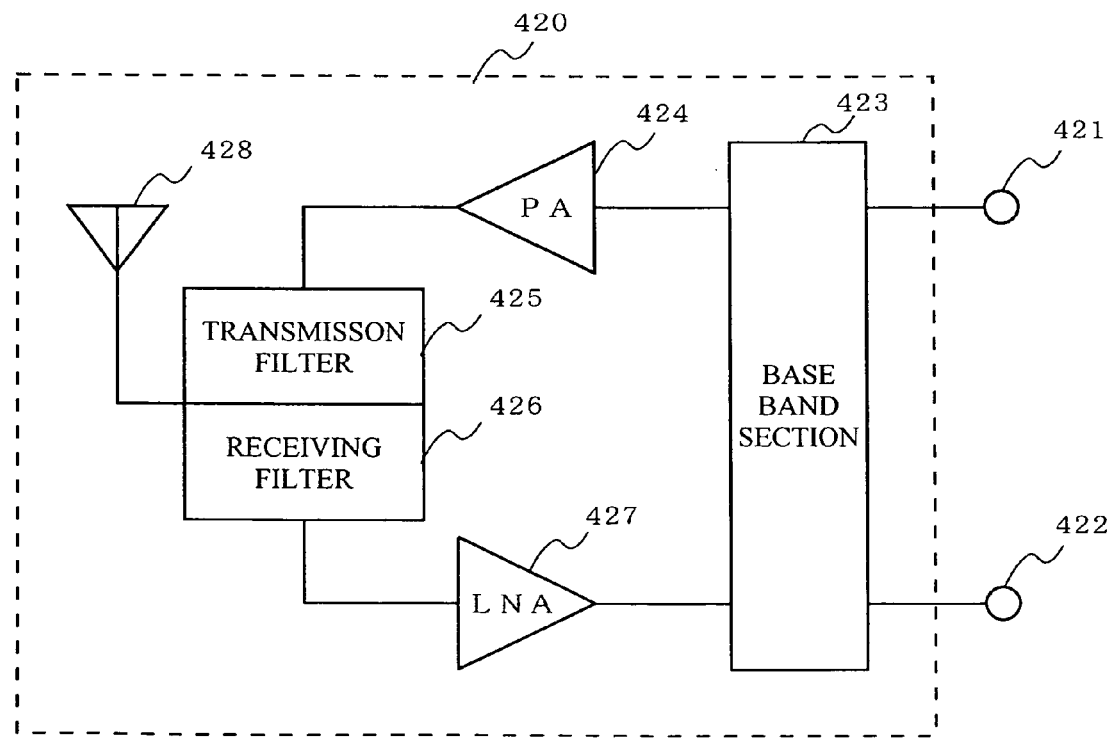
FIG. 12 shows an example of a communication apparatus including the duplexer.
Figure 13A:
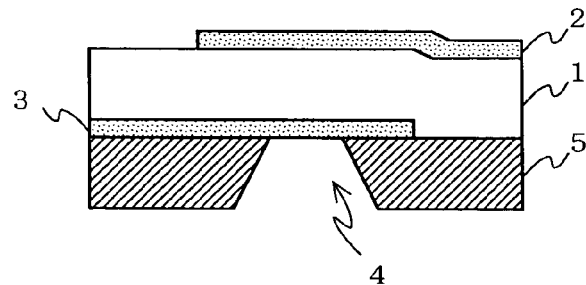
FIG. 13A through FIG. 13D illustrate a conventional acoustic resonator.
Figure 13B:
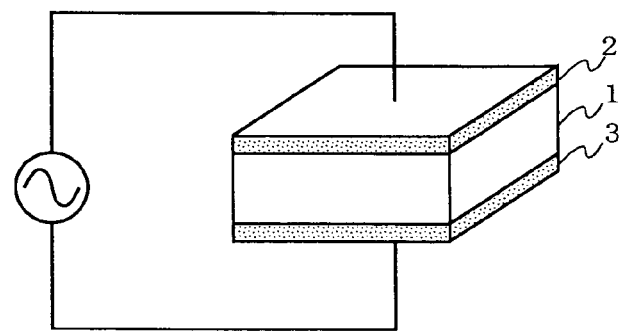
Figure 13C:
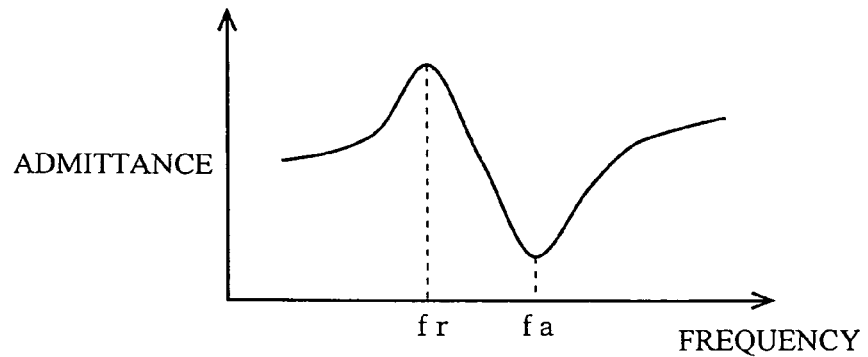
Figure 13D:
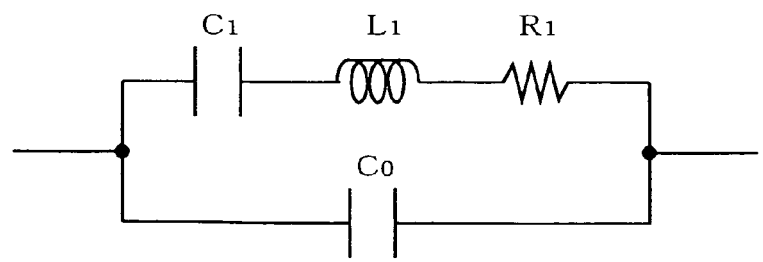
Figure 14:
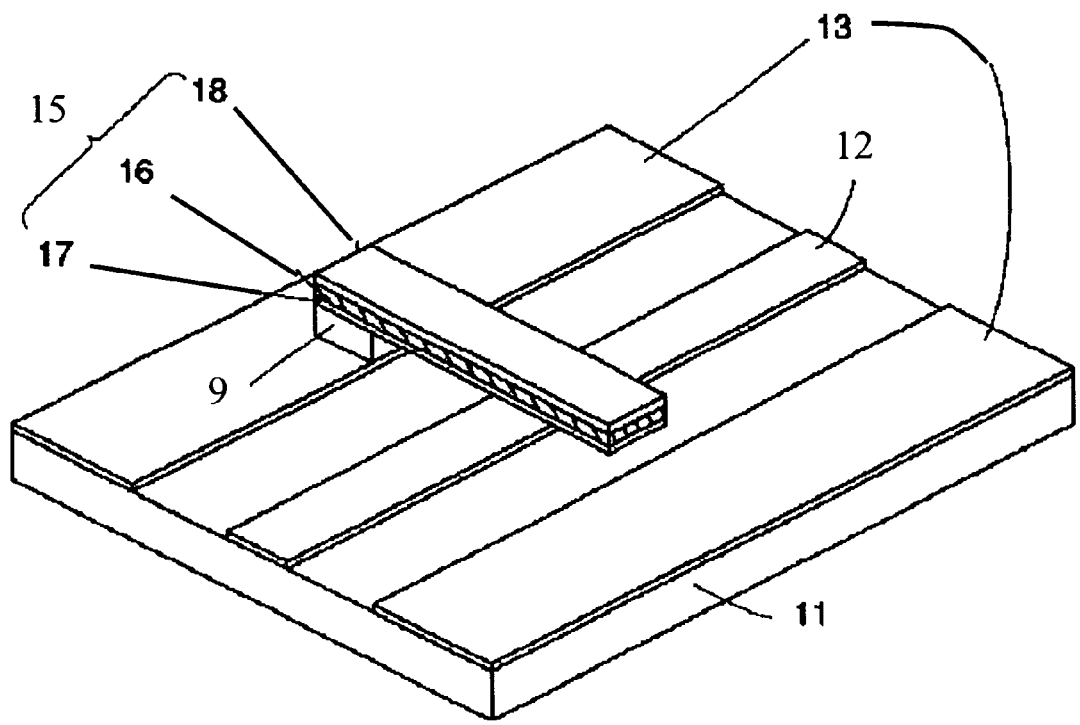
FIG. 14 is an isometric view of a conventional micromachine switch.
Figure 15:
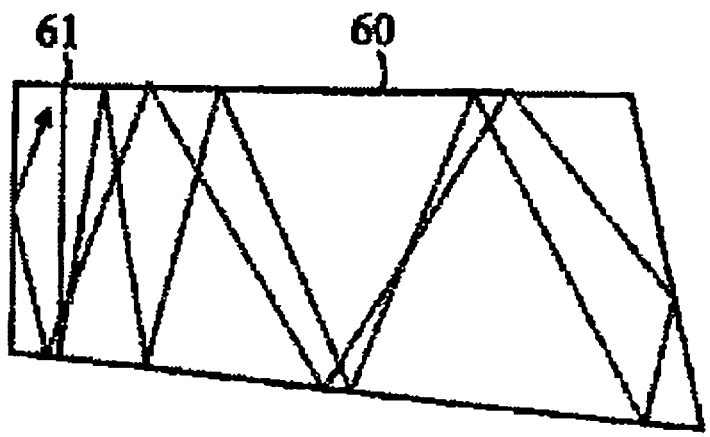
FIG. 15 shows an example of a cavity used in a conventional acoustic resonator.
Figure 16:
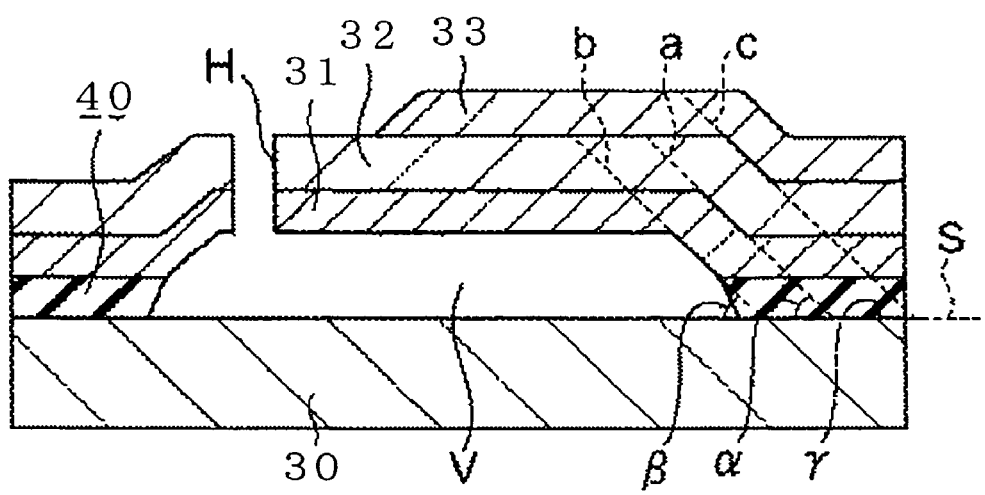
FIG. 16 shows another conventional acoustic resonator.

FIG. 12 shows an example of a communication apparatus 420 including the duplexer shown in FIG. 11. In the communication apparatus 420 shown in FIG. 12, a signal which is input from a transmission terminal 421 passes through a baseband section 423, is amplified by a power amplifier (PA) 424, is filtered by a transmission filter 425, and is transmitted from an antenna 428 as a radio wave. A signal which is received by the antenna 428 is filtered by a receiving filter 426, is amplified by a low noise amplifier (LNA) 427, passes through the baseband section 423, and is sent to a receiving terminal 422. The ladder type filter described above is usable for at least one of the transmission filter 425 and the receiving filter 426. With such a structure, the communication apparatus 420 with low power consumption and low noise can be realized.

While the invention has been described in detail, the foregoing description is in all aspects illustrative and not restrictive. It is understood that numerous other modifications and variations can be devised without departing from the scope of the invention.

What is claimed is:

1. An acoustic resonator vibrating at a predetermined frequency, comprising:
    a substrate;
    a vibration section including an upper electrode, a lower electrode, and a piezoelectric body formed of a piezoelectric thin film and interposing the upper electrode and the lower electrode, the piezoelectric body, the upper electrode, and the lower electrode having the same size and exactly overlapping each other in the vertical projection direction; and
    a support section provided between the lower electrode and said substrate, said support section having a vertical cross-section, at least a portion of which has a curvature.

2. An acoustic resonator according to claim 1, wherein the vertical cross-section of said support section is narrowest at a central portion in a thickness direction thereof or the vicinity thereof.

3. An acoustic resonator according to claim 1, wherein the vertical cross-section of said support section is widest at a central portion in a thickness direction thereof or the vicinity thereof.

4. An acoustic resonator according to claim 1, wherein a surface of said support section which is in contact with said substrate and a surface of said support section which is in contact with the lower electrode are parallel to each other.

5. A composite device including a plurality of acoustic resonators and at least one micromachine switch, wherein the composite device comprises at least one acoustic resonator according to claim 1 and at least one micromachine switch utilizing a piezoelectric effect and an electrostatic effect, the at least one micromachine switch comprising:
- a substrate;
- a driving electrode provided on said substrate;
- a movable section including an upper electrode, a lower electrode, a piezoelectric body formed of a piezoelectric thin film and interposing the upper electrode and the lower electrode, and a movable electrode for signal lines; and
- a support section provided between the movable section and said substrate, said support section having a vertical cross-section, at least a portion of which having a curvature.

6. A duplexer comprising at least one composite device according to claim 5.

7. A communication apparatus comprising at least one duplexer according to claim 6.

8. A filter comprising at least one acoustic resonator according to claim 1.

9. A micromachine switch utilizing a piezoelectric effect and an electrostatic effect, comprising:
- a substrate;
- a driving electrode provided on said substrate;
- a movable section including an upper electrode, a lower electrode, a piezoelectric body formed of a piezoelectric thin film and interposing the upper electrode and the lower electrode, and a movable electrode for signal lines; and
- a support section provided between the movable section and said substrate, said support section having a vertical cross-section, at least a portion of which having a curvature, and the vertical cross-section is narrowest at a central portion in a thickness direction thereof or the vicinity thereof.

10. A micromachine switch according to claim 9, wherein a surface of said support section which is in contact with said substrate and a surface of said support section which is in contact with the lower electrode are parallel to each other.

* * * * *